United States Patent
Tseng et al.

(10) Patent No.: US 10,277,206 B2
(45) Date of Patent: Apr. 30, 2019

(54) INTEGRATED CIRCUIT WITH AN OSCILLATING SIGNAL-GENERATING ASSEMBLY

(71) Applicant: Taiwan Semiconductor Manufacturing Company Limited, Hsinchu (TW)

(72) Inventors: Nan-Hsin Tseng, Tainan (TW); Ping-Han Tsai, New Taipei (TW); Po-Yu Chen, Hsinchu County (TW); Wei-Hao Kao, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 192 days.

(21) Appl. No.: 15/413,738

(22) Filed: Jan. 24, 2017

(65) Prior Publication Data

US 2018/0152178 A1 May 31, 2018

Related U.S. Application Data

(60) Provisional application No. 62/427,181, filed on Nov. 29, 2016.

(51) Int. Cl.
*H03K 3/03* (2006.01)
*G01R 31/28* (2006.01)
*G06F 17/50* (2006.01)
*G01R 31/317* (2006.01)

(52) U.S. Cl.
CPC ....... *H03K 3/0315* (2013.01); *G01R 31/2856* (2013.01); *G01R 31/2882* (2013.01); *G01R 31/31727* (2013.01); *G06F 17/5031* (2013.01)

(58) Field of Classification Search
CPC .............. H03K 3/0315; G01R 31/3016; G01R 31/2856; G01R 31/2882; G01R 31/31725; G01R 31/31727; G06F 17/5031
See application file for complete search history.

(56) References Cited

U.S. PATENT DOCUMENTS

| | | | | |
|---|---|---|---|---|
| 6,134,191 A * | 10/2000 | Alfke | ................ | G01R 31/3016 324/73.1 |
| 8,224,604 B1 * | 7/2012 | Amrutur | ............ | G01R 31/3016 327/153 |
| 9,602,083 B2 * | 3/2017 | Bollapalli | ............ | H03K 3/0315 |
| 2006/0186938 A1 * | 8/2006 | Cao | ...................... | H03K 3/0315 327/258 |

(Continued)

*Primary Examiner* — Ryan Johnson
(74) *Attorney, Agent, or Firm* — Jones Day

(57) ABSTRACT

An integrated circuit includes a circuit unit and an oscillating signal-generating assembly. The circuit unit includes a plurality of first cells. The oscillating signal-generating assembly is configured to generate different oscillating signals and includes a ring oscillator, a signal line, and a switching unit. The ring oscillator includes a plurality of second cells, each of which has an output terminal. The second cells are of the same type as the first cells. The signal line is configured to receive the different oscillating signals. The switching unit is coupled between the ring oscillator and the signal line and is configured to selectively couple the output terminals of the second cells to the signal line. A timing characteristic of a cell of the same type as the first cells can be estimated from the different oscillating signals.

20 Claims, 9 Drawing Sheets

(56) References Cited

U.S. PATENT DOCUMENTS

2010/0079212 A1* 4/2010 Sugiyama ............ H03K 3/0315
331/57
2011/0006851 A1* 1/2011 Kim ....................... H03K 5/133
331/57

* cited by examiner

INTEGRATED CIRCUIT WITH AN OSCILLATING SIGNAL-GENERATING ASSEMBLY

CROSS-REFERENCE TO RELATED APPLICATION

This application claims priority to U.S. Provisional Patent Application No. 62/427,181, filed Nov. 29, 2016, which is incorporated herein by reference in its entirety.

BACKGROUND

An integrated circuit includes a plurality of cells. A cell, such as a standard cell, includes one or more logic gates, e.g., a NOT gate or an inverter. In the design of the integrated circuit, the cells are retrieved from a cell library and are placed at locations in a layout. The cell library associates the cells with timing characteristics. During the design, simulation is performed on the layout verifying that the integrated circuit functions as intended. Simulation results can be made accurate by providing the cell library with realistic timing characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
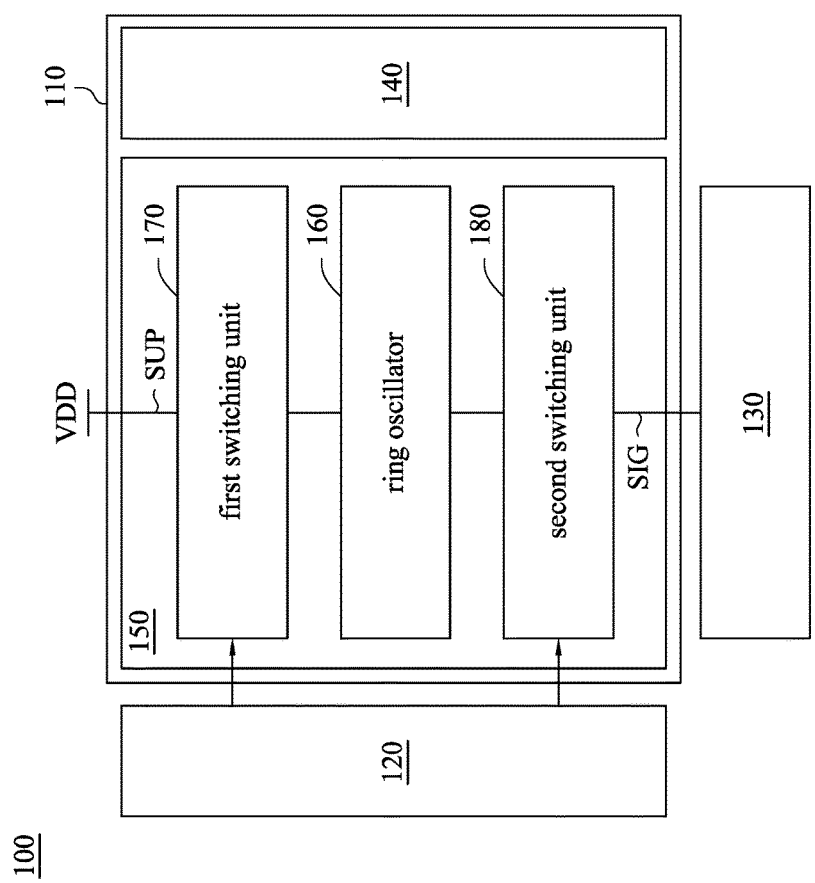
FIG. 1 is a schematic diagram that illustrates an exemplary system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic diagram that illustrates an exemplary system 100 in accordance with some embodiments. The example system 100 includes an integrated circuit 110, a switch controller 120, and an estimating unit 130. The integrated circuit 110, e.g., an application specific integrated circuit (ASIC), includes a circuit unit 140 and an oscillating signal-generating assembly 150. In this embodiment, the circuit unit 140 is a processor, such as a reduced instructions set computer (RISC) processor, e.g., an advanced RISC machine (ARM) processor, and is configured to control operations of components of an electronic device, e.g., mobile devices, such as smartphones, using a plurality of logic cells. In a design phase, a timing characteristic associated with a logic cell is obtained by simulating the logic cell using a software tool. The obtained timing characteristic is associated with a cell of a cell library that is of the same type as the logic cell. Such a timing characteristic does not account for variations that occur in an integrated circuit as manufactured and therefore may be inaccurate. In embodiments described herein, the integrated circuit 110 includes the oscillating signal-generating assembly 150 that functions in concert with the switch controller 120 and the estimating unit 130 (e.g., during a testing phase where the switch controller 120 and the estimating unit 130 are part of a test bed into which the integrated circuit 110 is inserted) to provide post-fabrication timing estimates that are likely more accurate.

As described in further detail below, the oscillating signal-generating assembly 150 includes a ring oscillator 160 responsive to a first switching unit 170 connected to a supply line (SUP) and a second switching unit 180 connected to a signal line (SIG). The switch controller 120 is connected to and is configured to control operation of the first and second switching units 170, 180. The construction as such permits the assembly 150 to generate different oscillating signals at the signal line (SIG). The estimating unit 130 is connected to the signal line (SIG) and is configured to estimate a timing characteristic, e.g., a delay time, of a cell or the sum of delay times of two or more cells that is/are of the same type as cells, e.g., cells (a1-a7) in FIG. 2, of the circuit unit 140 from the different oscillating signals. The estimate is generally more realistic than that obtained by simulation. That estimate can be used to update a delay time of a cell or the sum of delay times of two or more cells of a cell library that is/are of the same type as the cells (a1-a7) of the circuit unit 140. As such, a more accurate simulation of the cell can be achieved using the updated cell library, e.g., during a design phase of an integrated circuit. The estimated delay times can also be used as part of a quality control test for the integrated circuit 110 (e.g., where failing integrated circuits are discarded).

Figure 2:
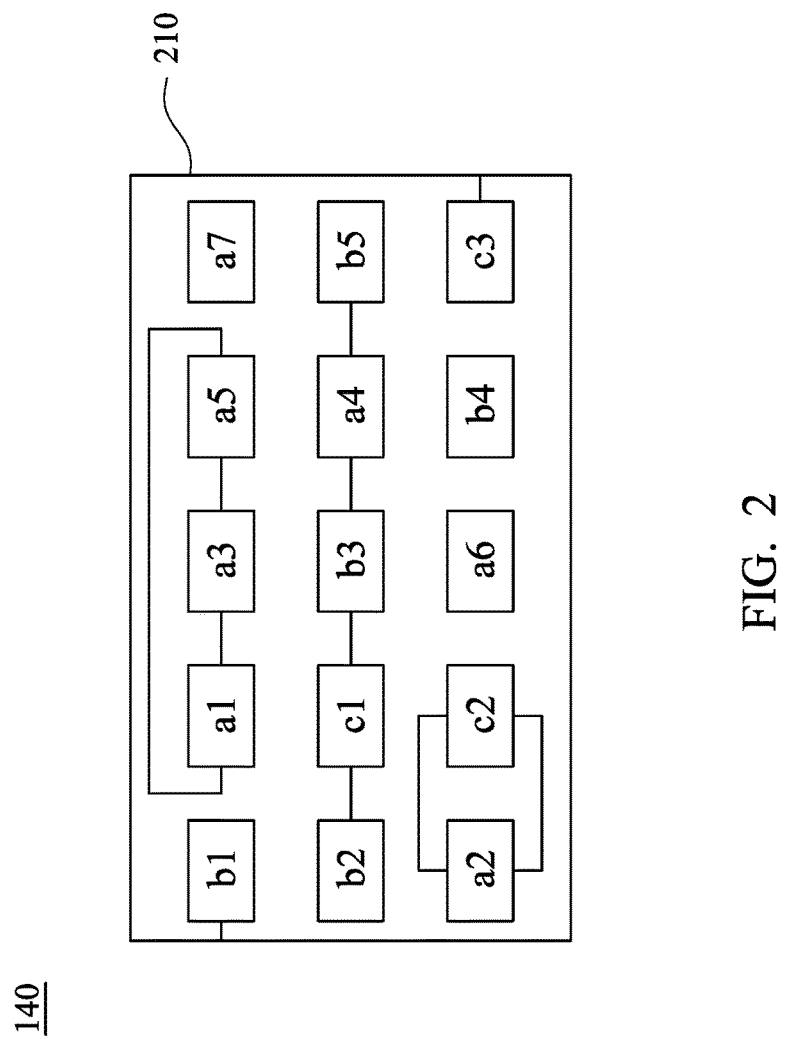
FIG. 2 is a schematic diagram that illustrates an exemplary circuit unit in accordance with some embodiments.

FIG. 2 is a schematic diagram that illustrates an exemplary circuit unit 140 in accordance with some embodiments. The circuit unit 140 includes a substrate 210 and a plurality of cells (a1-c3) over the substrate 210. Timing of these cells, and combinations thereof, are estimated using the oscillating signal-generating assembly 150, the switch controller 120, and the estimating unit 130. A cell is configured to perform a circuit function. For example, the cell is an inverter that inverts a signal from low to high and vice versa. In some embodiments, the cell includes an AND gate, a NAND gate, an OR gate, a NOR gate, an XOR gate, an XNOR gate, another logic gate, or a combination thereof. Such a cell can therefore be termed as a standard cell. In other embodiments, the cell includes a logic gate and a passive/active device, e.g., a resistor, a capacitor, an inductor, a transistor, a diode, or the like.

The cells (a1-a7) are of the same type, e.g., inverter. The cells (b1-b5) are of the same type, e.g., NAND gate, but are of different type than the cells (a1-a7). The cells (c1-c3) are of the same type, e.g., combination of two or more logic gates, but are of different type than the cells (a1-a7, b1-b5). It should be understood that the circuit unit 140 may include any number/type of cells.

In the design of the integrated circuit 110, the cells (a1-c3) are first placed at various locations in a layout during a placement phase. Then, during a subsequent routing phase, the cells (a1-c3) are coupled to components external to the circuit unit 140 and to each other through vertical metal lines, i.e., vias, and horizontal metal lines. This routing imparts desired functionality to the integrated circuit 110, e.g., routing inputs and outputs to/from the integrated circuit 110, directing ordered logic among the cells (a1-c3). For example, the cell (b1) has an input terminal connected to a first component (not shown) external to the circuit unit 140. The cells (b2, c1, b3, a4, b5) are connected in series. The cells (a2, c2) are connected in parallel. The cells (a1, a3, a5) are connected in a ring/loop. The cell (c3) has an output terminal connected to a second component (not shown) external to the circuit unit 140.

The design of the integrated circuit 110 is performed with the assistance of a software tool, e.g., electronic design automation (EDA). The cells (a1-c3), as well as timing characteristics, e.g., a typical or average delay time, associated therewith, are stored in a cell library of the EDA. The delay time is, for example, the time between when a cell receives an input at an input terminal thereof and the time an output is provided by the cell at an output terminal thereof. After a simulation phase, during which the integrated circuit 110 is verified by the EDA for functionality, the integrated circuit 110 undergoes manufacturing.

Actual timing characteristics, e.g., a delay time, of the cells (a1-c3) in a manufactured integrated circuit 110 may vary from one region of the substrate 210 to another. This is due to variations, e.g., in the manufacturing process. For example, an instance of a cell, e.g., cell (a2), at a lower-left corner of the substrate 210 may have a different delay time from an instance of the same type of a cell, e.g., cell (a7), at an upper-right corner of the substrate 210. This sort of variation is referred to as on-chip variation (OCV). As described hereinafter, the oscillating signal-generating assembly 150 facilitates estimation of a delay time of one cell or the sum of delay times of two or more cells that is/are of the same type as the cells (a1-a7) of the circuit unit 140.

Figure 3:
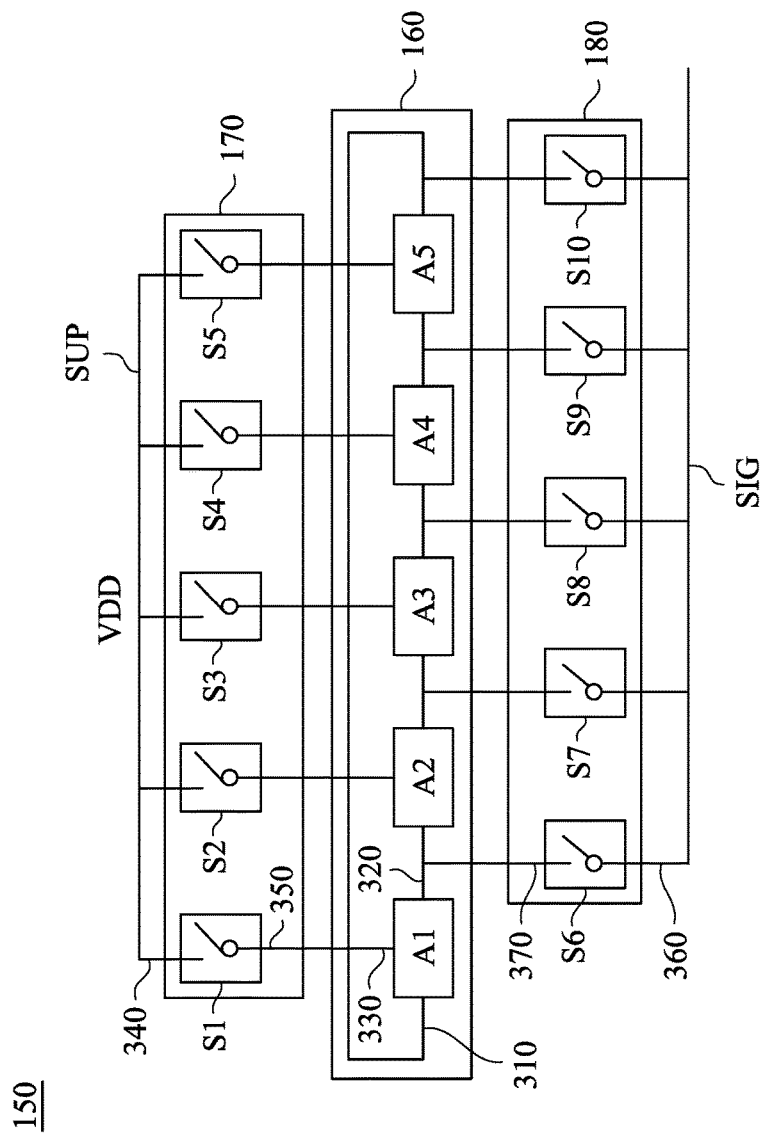
FIG. 3 is a schematic diagram that illustrates an exemplary oscillating signal-generating assembly in accordance with some embodiments.

FIG. 3 is a schematic diagram that illustrates an exemplary oscillating signal-generating assembly 150 in accordance with some embodiments. The ring oscillator 160 includes cells (A1-A5) that are of the same type as the cells (a1-a7). The cells (A1-A5) are connected in a loop. That is, each of the cells (A1-A5) has an input terminal 310 and an output terminal 320. For clarity of illustration, only the input and output terminals 310, 320 of the cell (A1) is labeled in FIG. 3. Input and output terminals 310, 320 of an adjacent pair of the cells (A1-A5) are connected to each other. Input and output terminals 310, 320 of first and last cells (A1, A5) in the loop are connected to each other.

In operation, the (A1-A7), which are of the same or similar type to the integrated circuit 110 cells (a1-a5), are selectively powered and connected to generate a periodic signal at the signal line (SIG) that is correlated with timing of one or more integrated circuit 110 cells (a1-a5). In an example where the cells (a1-a5) are inverters and are all powered and connected in series, the five ring oscillator 160 cells (A1-A5) can produce a periodic output at the signal line (SIG) in a time period equal to a signal propagating through the five ring oscillator 160 inverter cells (A1-A5). That periodic signal at the signal line (SIG) is nearly equal to or correlated with the time it would take a signal to propagate through five integrated circuit 110 inverter cells (a1-a5) (e.g., because cells a1-a5 are fabricated on the same integrated circuit as cells A1-A5). Such an estimate can be used in optimization of the integrated circuit 110 during future design, during operation, or as part of a quality control process. That estimate may be able to account for on-chip variations that are unknown at the time of design of the integrated circuit 110.

To connect the ring oscillator 160 cells (A1-A5) to make a desired estimate, the supply line (SUP) is configured to receive a supply voltage (VDD). Each of the cells (A1-A5) further includes a supply terminal 330 (only the supply terminal 330 of the cell (A1) is labeled in FIG. 3 for clarity of illustration). The first switching unit 170 is connected between the ring oscillator 160 and the supply line (SUP) and is configured to selectively connect the supply terminals 330 of the cells (A1-A5) to the supply line (SUP). In this embodiment, the switching unit 170 includes switches (S1-S5), each of which has a first switch terminal 340 and a second switch terminal 350 (only the switch terminals 340, 350 of the switch (S1) is labeled in FIG. 3 for clarity of illustration). A switch is operable between an "on" state, where the first and second switch terminals thereof is connected to each other, and an "off" state, where the first and second switch terminals thereof are disconnected from each other. The switch terminals 340 of the switches (S1-S5) are connected to the supply line (SUP). The switch terminals 350 of the switches (S1-S5) are connected to the supply terminals 330 of the cells (A1-A5), respectively.

The second switching unit 180 is connected between the ring oscillator 160 and the signal line (SIG) and is configured to selectively connect the output terminals 320 of the cells (A1-A5) to the signal line (SIG). In this embodiment, the switching unit 180 includes switches (S6-S10), each of which has a first switch terminal 360 and a second switch terminal 370 (only the first and second switch terminals 360, 370 of the switch (S6) is labeled in FIG. 3 for clarity of illustration). The switch terminals 360 of the switches (S6-S10) are connected to the signal line (SIG). The switch terminals 370 of the switches (S6-S10) are connected to the output terminals 320 of the cells (A1-A5), respectively. In this embodiment, each of the switches (S1-S10) includes one or more transistors.

FIGS. 4-8 are schematic diagrams that illustrate exemplary states of operation of the assembly 150 in accordance with some embodiments. The estimation of a time characteristic, e.g., a delay time, of a cell or the sum of delay times of two or more cells that is/are of the same type as the cells (a1-a7) with the use of the assembly 150 will now be described with further reference to FIGS. 1 and 2 for ease of understanding. It should be understood that such operation is applicable to structures other than those of FIGS. 1 and 2.

Figure 4:
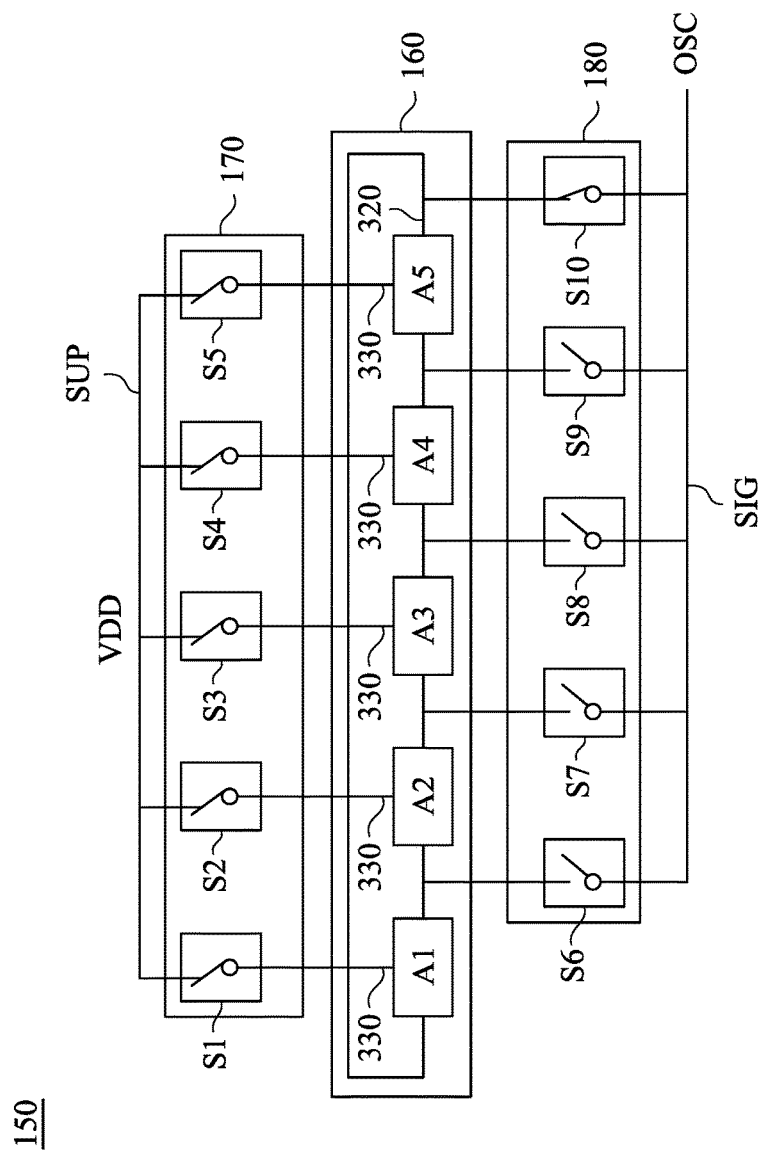
FIGS. 4-8 are schematic diagrams that illustrate exemplary states of operation of an oscillating signal-generating assembly in accordance with some embodiments.

When it is desired to estimate a delay time of one cell that is of the same type as the cells (a1-a7), the sum of delay times of the cells (A1-A5) is first determined. For example, the switch controller 120 first turns the switches (S1-S5) and one of the switches (S6-S10), e.g., switch (S10), on and the switches (S6-S9) off as illustrated in FIG. 4. This connects the terminals 330 of the cells (A1-A5) to the supply line (SUP) and the terminal 320 of the cell (A5) to the signal line (SIG). This, in turn, enables the ring oscillator 160 to generate an oscillating signal (OSC), the frequency ($f_{A1-5}$) of which is given by:

$$f_{A1-5} = 1/(2t_{A1-5}) \tag{EQ. 1}$$

where $t_{A1-5}$ is the sum of delay times of the cells (A1-A5).

Next, the estimating unit 130 measures the frequency ($f_{A1-5}$) at the signal line (SIG). Then, the estimating unit 130 calculate the sum of delay times ($t_{A1-5}$) of the cells (A1-A5) using the equation, which is derived from EQ. 1:

$$t_{A1-5} = 1/(2f_{A1-5}) \tag{EQ. 2}$$

Figure 5:
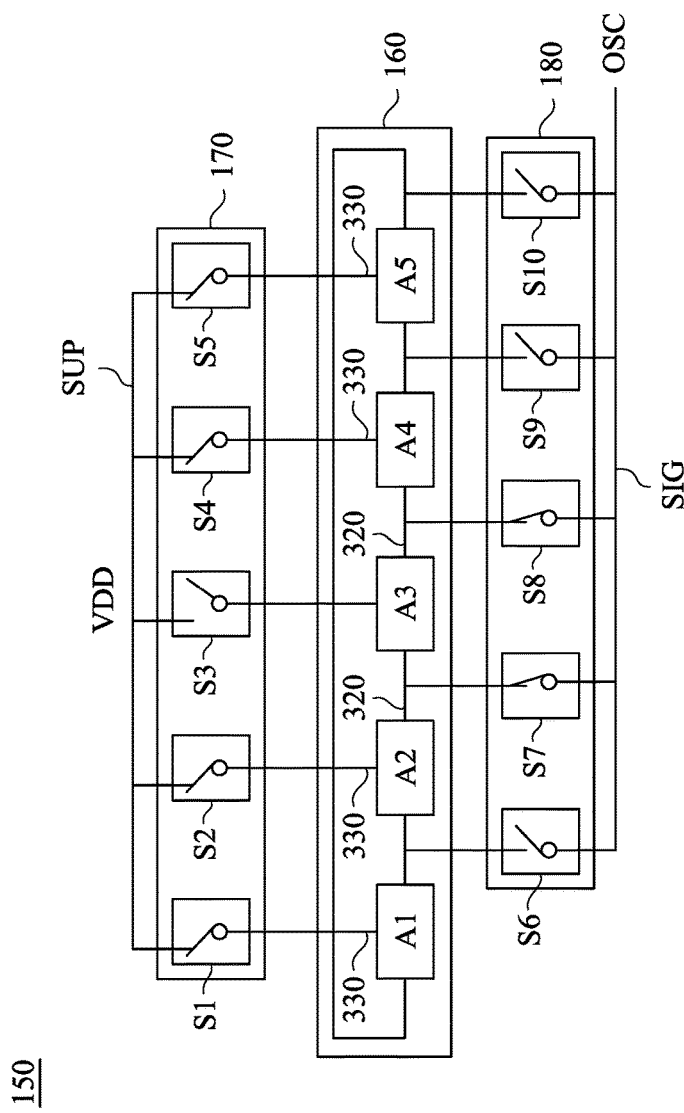

Once the sum of delay times of the cells (A1-A5) is determined, a delay time of each of the cells (A1-A5) is determined. For example, when determining a delay time of the cell (A3), the switch controller 120 first turns the switches (S1, S2, S4, S5, S7, S8) on and the switches (S3, S6, S9, S10) off as illustrated in FIG. 5. This connects the terminals 330 of the cells (A1, A2, A4, A5) to the supply line (SUP) and the terminals 320 of the cells (A2, A3) to the signal line (SIG), bypassing the cell (A3). This, in turn, enables the ring oscillator 160 to generate an oscillating signal (OSC), the frequency ($f_{A1245}$) of which is given by:

$$f_{A1245} = 1/(2t_{A1245}) \tag{EQ. 3}$$

where $t_{A1245}$ is the sum of delay times of the cells (A1, A2, A4, A5).

Next, the estimating unit 130 measures the frequency ($f_{A1245}$) at the signal line (SIG). Then, the estimating unit 130 calculates the sum of delay times ($t_{A1245}$) of the cells (A1, A2, A4, A5) using the equation, which is derived from EQ. 3:

$$t_{A1245} = 1/(2f_{A1245}) \tag{EQ. 4}$$

Then, the estimating unit 130 calculates the delay time ($t_{A3}$) of the cell (A3) using the equation:

$$t_{A3} = t_{A1-5} - t_{A1245} \tag{EQ. 5}$$

Figure 6:
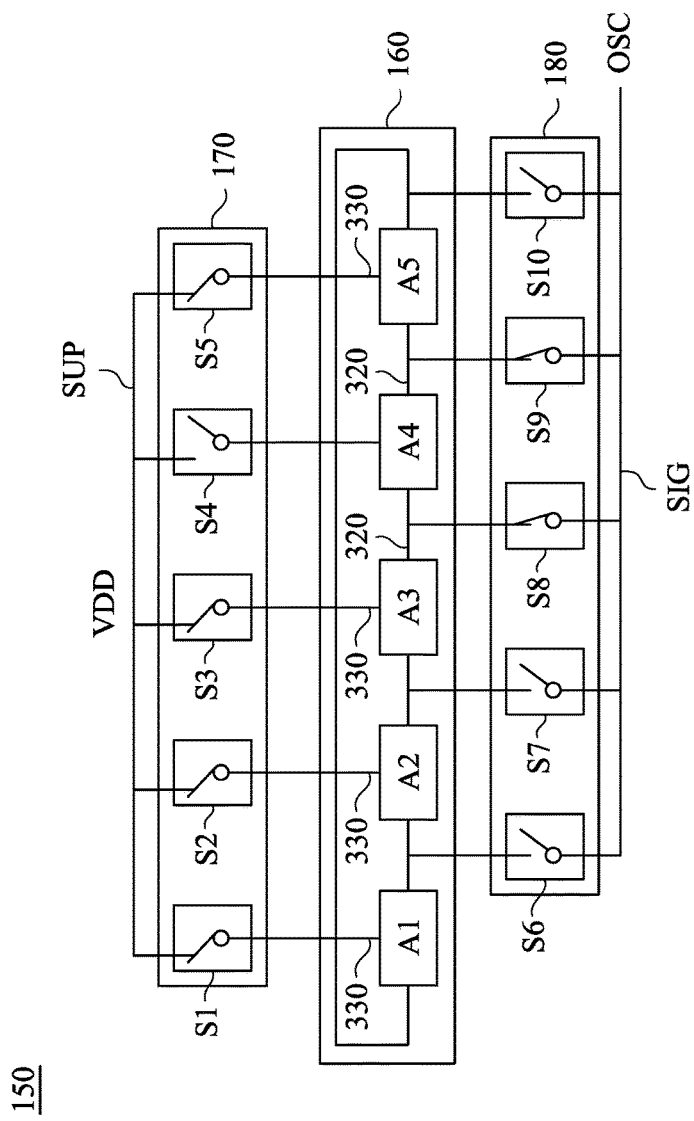

A delay time of another one of the cells (A1-A5) is determined in a similar manner. For example, when determining a delay time of the cell (A4), the switch controller 120 first turns the switches (S1-S3, S5, S8, S9) on and the switches (S4, S6, S7, S10) off as illustrated in FIG. 6. This connects the terminals 330 of the cells (A1-A3, A5) to the supply line (SUP) and the terminals 320 of the cells (A3, A4) to the signal line (SIG), bypassing the cell (A4). This, in turn, enables the ring oscillator 160 to generate an oscillating signal (OSC), the frequency ($f_{A1235}$) of which is given by:

$$f_{A1235} = 1/(2t_{A1235}) \tag{EQ. 6}$$

where $t_{A1235}$ is the sum of delay times of the cells (A1-A3, A5).

Next, the estimating unit 130 measures the frequency ($f_{A1235}$) at the signal line (SIG). Then, the estimating unit 130 calculates the sum of delay times ($t_{A1235}$) of the cells (A1-A3, A5) using the equation, which is derived from EQ. 6:

$$t_{A1235} = 1/(2f_{A1235}) \tag{EQ. 7}$$

Then, the estimating unit 130 calculates the delay time ($t_{A4}$) of the cell (A4) using:

$$t_{A4} = t_{A1-5} - t_{A1235} \tag{EQ. 8}$$

Once the delay time of each of the cells (A1-A5) has been determined, the estimating unit 130 estimates a delay time of a cell that is of the same type as the cells (a1-a7) based on the calculated delay times. For example, the estimating unit 130 obtains, e.g., a standard deviation or an average of the calculated delay times and estimates the obtained standard deviation/average as the delay time of the cell that is of the same type as the cells (a1-a7). Thereafter, a cell library is updated with the estimate.

Although the assembly 150 is exemplified such that only a number of cells of the circuit unit 140 are sampled by the ring oscillator 160, it should be understood that, after reading this disclosure, the ring oscillator 160 may be configured to sample a larger number of cells. It is noted that the larger the number of cells sampled, the nearer the estimate to the actual delay time of the cells of the circuit unit 140.

Figure 7:
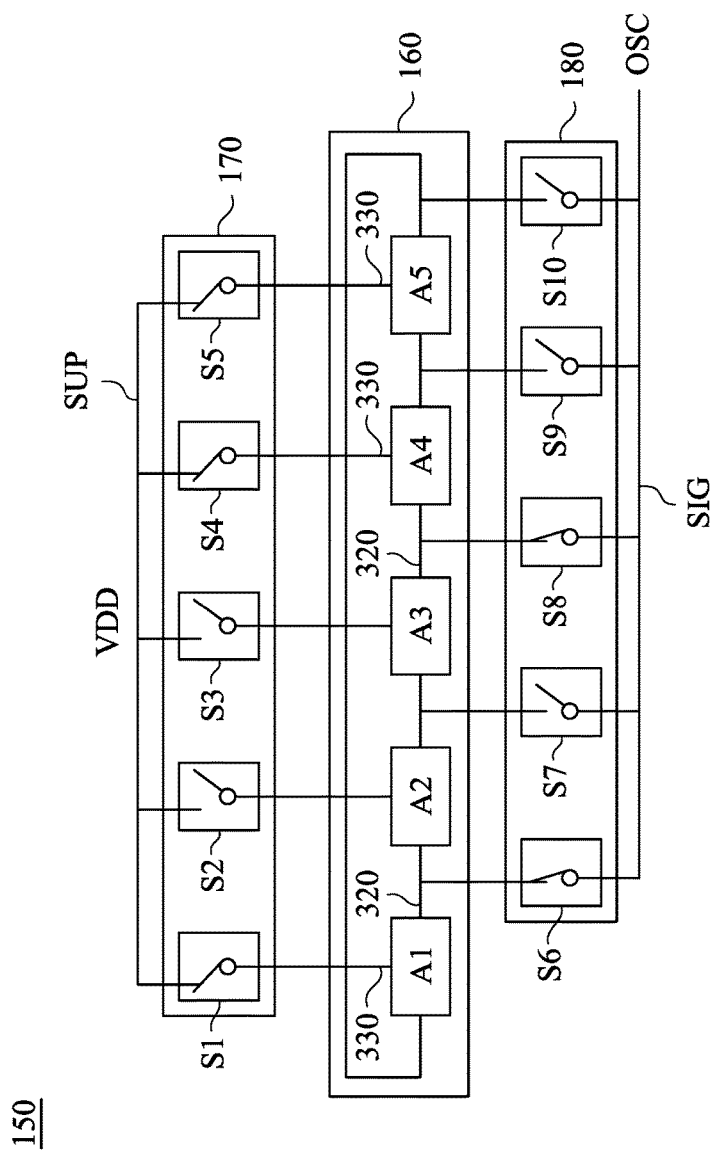

Now, when it is desired to estimate the sum of delay times of two cells that are of the same type as the cells (a1-a7), the sum of delay times of each adjacent pair of the cells (A1-A5) is determined. For example, when determining the sum of delay times of the cells (A2, A3), the switch controller 120 first turns the switches (S1, S4, S5, S6, S8) on and the switches (S2, S3, S7, S9, S10) off as illustrated in FIG. 7. This connects the terminals 330 of the cells (A1, A4, A5) to the supply line (SUP) and the terminals 320 of the cells (A1, A3) to the signal line (SIG), bypassing the cells (A2, A3). This, in turn, enables the ring oscillator 160 to generate an oscillating signal (OSC), the frequency ($f_{A145}$) of which is given by:

$$f_{A145} = 1/(2t_{A145}) \tag{EQ. 9}$$

where $t_{A145}$ is the sum of delay times of the cells (A1, A4, A5).

Next, the estimating unit 130 measures the frequency ($f_{A145}$) at the signal line (SIG). Then, the estimating unit 130 calculates the sum of delay times ($t_{A145}$) of the cells (A1, A4, A5) using the equation, which is derived from EQ. 9:

$$t_{A145} = 1/(2f_{A145}) \tag{EQ. 10}$$

Then, the estimating unit 130 calculates the sum of delay times ($t_{A23}$) of the cells (A2, A3) using:

$$t_{A23} = t_{A1-5} - t_{A145} \tag{EQ. 11}$$

Figure 8:
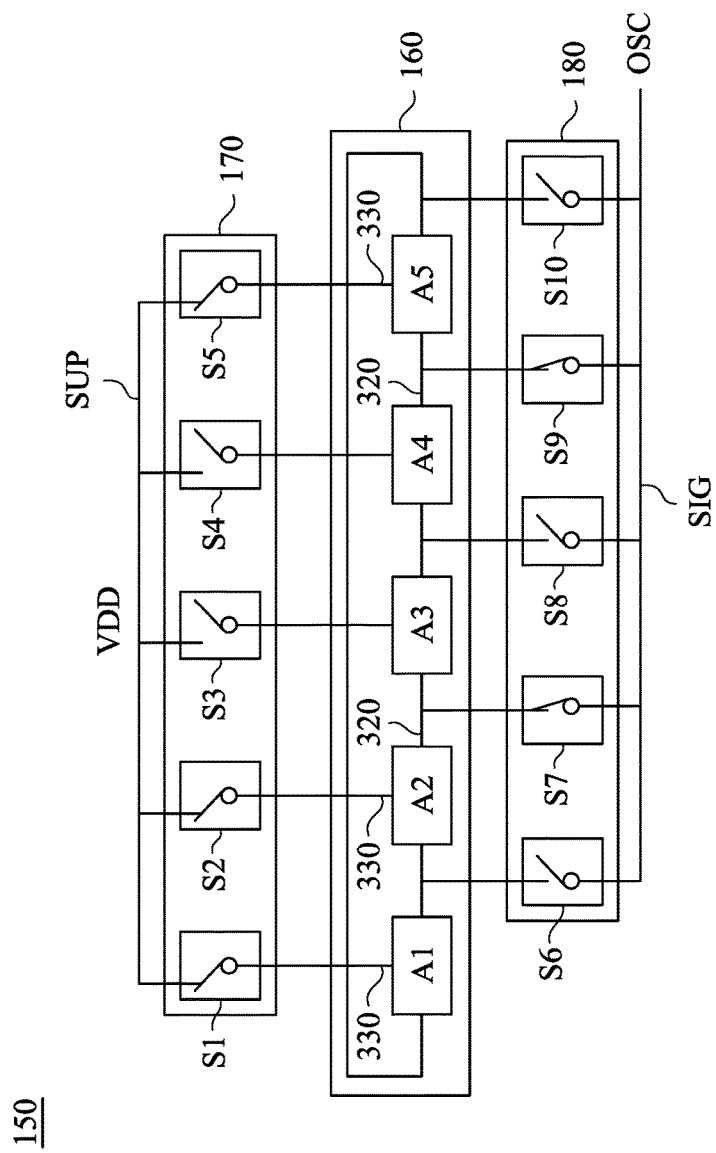

The sum of delay times of another two of the cells (A1-A5) is determined in a similar manner. For example, when determining the sum of delay times of the cells (A3, A4), the switch controller 120 first turns the switches (S1, S2, S5, S7, S9) on and the switches (S3, S4, S6, S8, S10) off as illustrated in FIG. 8. This connects the terminals 330 of the cells (A1, A2, A5) to the supply line (SUP) and the terminals 320 of the cells (A2, A4) to the signal line (SIG), bypassing the cells (A3, A4). This, in turn, enables the ring oscillator 160 to generate an oscillating signal (OSC), the frequency ($f_{A125}$) of which is given by:

$$f_{A125} = 1/(2t_{A125}) \tag{EQ. 12}$$

where $t_{A125}$ is the sum of delay times of the cells (A1, A2, A5).

Next, the estimating unit 130 measures the frequency ($f_{A125}$) at the signal line (SIG). Then, the estimating unit 130 calculates the sum of delay times ($t_{A125}$) of the cells (A1, A2, A5) using the equation, which is derived from EQ. 12:

$$t_{A125} = 1/(2f_{A125}) \tag{EQ. 13}$$

Then, the estimating unit 130 calculates the sum of delay times ($t_{A34}$) of the cells (A3, A4) using:

$$t_{A34} = t_{A1-5} - t_{A125} \tag{EQ. 14}$$

Once the sum of delay times of each adjacent pair of the cells (A1-A5) has been determined, the estimating unit 130 estimates the sum of delay times of two cells that are of the same type as the cells (a1-a7) based on the calculated sums of delay times. For example, the estimating unit 130 obtains, e.g., a standard deviation or an average of the calculated sums of delay times and estimates the obtained standard deviation/average as the sum of delay times of two cells that are of the same type as the cells (a1-a7). Thereafter, a cell library is updated with the estimate.

The sum of delay times of three or more cells that are of the same type as cells (a1-a7) may be estimated in a manner similar to those described above.

Figure 9:
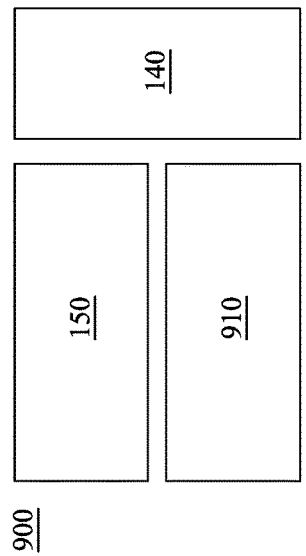
FIG. 9 is a schematic diagram that illustrates an exemplary integrated circuit in accordance with some embodiments.
Figure 10:
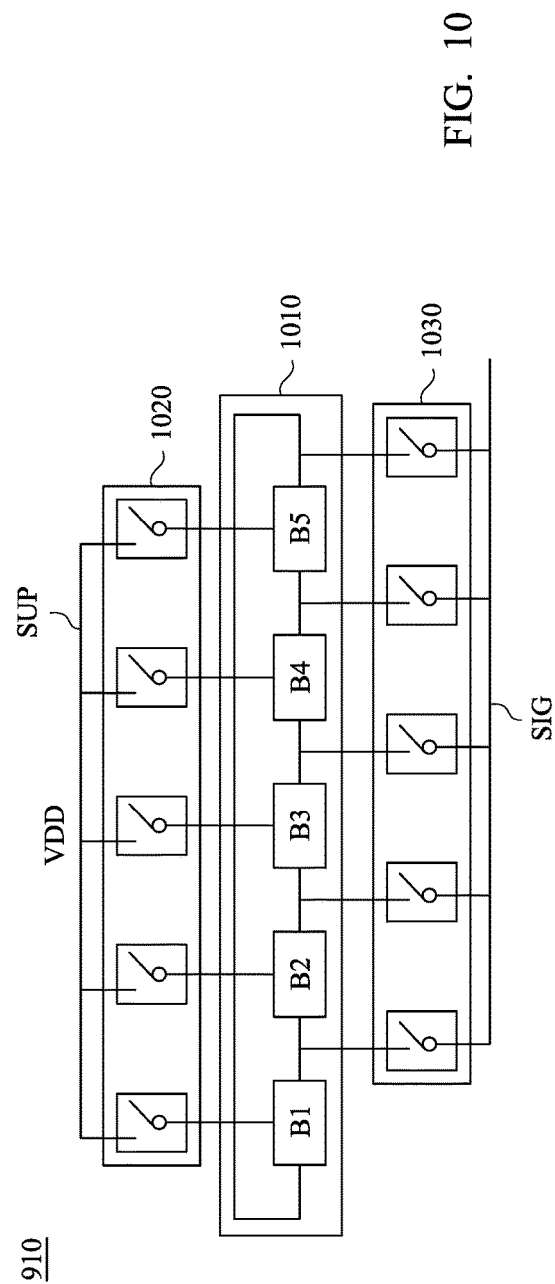
FIG. 10 is a schematic diagram that illustrates an exemplary oscillating signal-generating assembly in accordance with some embodiments.

Although the integrated circuit 110 is exemplified as using one assembly 150, it should be understood that, after reading this disclosure, the integrated circuit 110 may include any number of assemblies, each of which includes a ring oscillator that has a distinct cell type. For example, FIG. 9 is a schematic diagram that illustrates another exemplary integrated circuit 900 in accordance with some embodiments. When compared with the integrated circuit 110, the example integrated circuit 900 further includes a second oscillating signal-generating assembly 910 that, similar to the assembly 150, facilitates estimation of a delay time of one cell or the sum of delay times of two or more cells that are of the same type as the cells (b1-b5) of the circuit unit 140. In particular, FIG. 10 is a schematic diagram that illustrates an exemplary oscillating signal-generating assembly 910 in accordance with some embodiments. Similar to the assembly 150, the assembly 910 includes a ring oscillator 1010 responsive to a switching unit 1020 connected to the supply line (SUP) and a switching unit 1030 connected to the signal line (SIG).

The ring oscillator 1010 includes cells (B1-B5) connected in a loop and of the same type as the cells (b1-b5). The switching unit 1020 is connected between the ring oscillator 1010 and the supply line (SUP) and is configured to selectively connect supply terminals of the cells (B1-B5) to the supply line (SUP). The switching unit 1030 is connected between the ring oscillator 1010 and the signal line (SIG) and is configured to selectively connect output terminals of the cells (B1-B5) to the signal line (SIG). Since the construction of the switching units 1020, 1030 and the operation of the assembly 910 are similar to those described above in connection with the assembly 150, a description of the same is dispensed with herein for the sake of brevity.

In one embodiment, an integrated circuit comprises a circuit unit and an oscillating signal-generating assembly. The circuit unit includes a plurality of first cells. The oscillating signal-generating assembly is configured to generate different oscillating signals and includes a ring oscillator, a signal line, and a switching unit. The ring oscillator includes a plurality of second cells, each of which has an output terminal. The second cells are of the same type as the first cells. The signal line is configured to receive the different oscillating signals. The switching unit is coupled between the ring oscillator and the signal line and is configured to selectively couple the output terminals of the second cells to the signal line. A timing characteristic of a cell of the same type as the first cells can be estimated from the different oscillating signals.

In another embodiment, an integrated circuit comprises a circuit unit and an oscillating signal-generating assembly. The circuit unit includes a plurality of first cells. The oscillating signal-generating assembly includes a ring oscillator, a supply line, and a switching unit. The ring oscillator includes a plurality of second cells, each of which has a supply terminal. The second cells are of the same type as the first cells. The supply line is configured to receive a supply voltage. The switching unit is coupled between the ring oscillator and the supply line and is configured to selectively couple the supply terminals of the second cells to the supply line.

In another embodiment, a system comprises an integrated circuit and an estimating unit. The integrated circuit includes a circuit unit and an oscillating signal-generating assembly. The circuit unit includes a plurality of first cells. The oscillating signal-generating assembly is configured to generate different oscillating signals and includes a ring oscillator, a signal line, and a switching unit. The ring oscillator includes a plurality of second cells, each of which has an output terminal. The second cells are of the same type as the first cells. The signal line is configured to receive the different oscillating signals. The switching unit is coupled between the ring oscillator and the signal line and is configured to selectively couple the output terminals of the second cells to the signal line. The estimating unit is coupled to the signal line and is configured to estimate a timing characteristic of a cell that is of the same type as the first cells from the different oscillating signals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a circuit unit including a plurality of first cells and a plurality of third cells; and
   an oscillating signal-generating assembly configured to generate different oscillating signals and including:
   a ring oscillator including a plurality of second cells, each of which has an output terminal, the plurality of the second cells being of the same type as the plurality of the first cells,
   a signal line configured to receive the different oscillating signals, and a switching unit coupled between the ring oscillator and the signal line and configured to selectively couple the output terminals of the plurality of the second cells to the signal line, whereby a timing characteristic of a cell of the same type as the plurality of the first cells can be estimated from the different oscillating signals;
   a supply line configured to receive a supply voltage;
   a second ring oscillator including a plurality of fourth cells, each of which has an output terminal, the plurality of the fourth cells being of the same type as the plurality of the third cells, and
   a second switching unit coupled between the second ring oscillator and the signal line and configured to selectively couple the output terminals of the plurality of the fourth cells to the signal line.

2. The integrated circuit of claim 1, wherein:
   the plurality of third cells are of different type than the plurality of the first cells;
   a timing characteristic of a cell of the same type as the plurality of the third cells can be estimated from the different oscillating signals;

a cell library can be updated with the timing characteristic estimate; and the updated cell library can be used to achieve a more accurate simulation of the circuit unit.

3. The integrated circuit of claim 1, wherein the switching unit includes a plurality of switches, each of which has a first switch terminal coupled to the output terminal of a respective one of the plurality of the second cells and a second switch terminal coupled to the signal line.

4. The integrated circuit of claim 1, wherein the oscillating signal-generating assembly further includes a second ring oscillator including a plurality of third cells that are of different type than the plurality of the second cells.

5. An integrated circuit comprising:
a circuit unit including a plurality of first cells; and an oscillating signal-generating assembly including:
a ring oscillator including a plurality of second cells, each of which has a supply terminal, the plurality of the second cells being of the same type as the plurality of the first cells;
a supply line configured to receive a supply voltage; and
a switching unit coupled between the ring oscillator and the supply line and configured to selectively couple the supply terminals of the plurality of the second cells to the supply line,
wherein each of the plurality of the second cells further has an output terminal, the integrated circuit further comprising:
a signal line; and
a second switching unit coupled between the ring oscillator and the signal line and configured to selectively couple the output terminals of the plurality of the second cells to the signal line.

6. The integrated circuit of claim 5, wherein the switching unit includes a plurality of switches, each of which has a first switch terminal coupled to the supply terminal of a respective one of the plurality of the second cells and a second switch terminal coupled to the supply line.

7. The integrated circuit of claim 5, wherein the second switching unit includes a plurality of switches, each of which has a first switch terminal coupled to the output terminal of a respective one of the plurality of the second cells and a second switch terminal coupled to the signal line.

8. The integrated circuit of claim 5, wherein the circuit unit further includes a plurality of third cells that are of different type than the plurality of the first cells.

9. The integrated circuit of claim 5, wherein the oscillating signal-generating assembly further includes a second ring oscillator including a plurality of third cells that are of different type than the plurality of the second cells.

10. The integrated circuit of claim 5, further comprises an estimating unit configured to:
measure a first frequency of one of the output terminals at the signal line; and
calculate the sum of first delay times based on the first frequency.

11. The integrated circuit of claim 10, wherein the estimating unit is further configured to:
measure a second frequency of another one of the output terminals at the signal line;
calculate the sum of second delay times based on the second frequency; and
calculate the difference between the sum of the first delay times and the sum of the second delay times.

12. A system comprising:
an integrated circuit including:
a circuit unit including a plurality of first cells, and
an oscillating signal-generating assembly configured to generate different oscillating signals and including:
a ring oscillator including a plurality of second cells, each of which has an output terminal, the plurality of the second cells being of the same type as the plurality of the first cells,
a signal line is configured to receive the different oscillating signals, and
a switching unit coupled between the ring oscillator and the signal line and configured to selectively couple the output terminals of the plurality of the second cells to the signal line; and
an estimating unit coupled to the signal line and configured to estimate a timing characteristic of a cell that is of the same type as the plurality of the first cells from the different oscillating signals,
wherein the estimating unit is further configured to:
measure a first frequency of one of the different oscillating signals at the signal line;
calculate the sum of first delay times based on the first frequency;
measure a second frequency of another one of the different oscillating signals at the signal line;
calculate the sum of second delay times based on the second frequency; and
calculate a difference between the sum of the first delay times and the sum of the second delay times.

13. The system of claim 12, wherein the estimating unit is further configured to determine a delay time of each of the plurality of the second cells from the different oscillating signals.

14. The system of claim 12, further comprising a switch controller coupled to and configured to control operation of the switching unit.

15. The system of claim 12, wherein the circuit unit further includes a plurality of third cells that are of different type than the plurality of the first cells.

16. The system of claim 12, wherein the switching unit includes a plurality of switches, each of which has a first switch terminal coupled to the output terminal of a respective one of the plurality of the second cells and a second switch terminal coupled to the signal line.

17. The system of claim 12, wherein each of the plurality of the second cells further includes a supply terminal, the oscillating signal-generating assembly further including
a supply line configured to receive a supply voltage, and
a second switching unit coupled between the ring oscillator and the supply line and configured to selectively couple the supply terminals of the plurality of the second cells to the supply line.

18. The system of claim 17, wherein the second switching unit includes a plurality of switches, each of which has a first switch terminal coupled to the supply terminal of a respective one of the plurality of the second cells and a second switch terminal coupled to the supply line.

19. The system of claim 17, further comprising a switch controller coupled to and configured to control operation of the second switching unit.

20. The system of claim 12, further comprising a second ring oscillator including a plurality of third cells that are of different type than the plurality of the second cells.

* * * * *